US012805229B2

(12) United States Patent
Peng

(10) Patent No.: US 12,805,229 B2

(45) Date of Patent: Nov. 17, 2026

(54) SEMICONDUCTOR DEVICE AND FORMING METHOD OF THE SAME

(71) Applicant: NANYA TECHNOLOGY CORPORATION, New Taipei City (TW)

(72) Inventor: Jung Tzu Peng, New Taipei City (TW)

(73) Assignee: NANYA TECHNOLOGY CORPORATION, New Taipe City (TW)

(*) Notice: Subject to any disclaimer, the term of this patent is extended or adjusted under 35 U.S.C. 154(b) by 185 days.

(21) Appl. No.: 19/004,434

(22) Filed: Dec. 29, 2024

(65) Prior Publication Data

US 2026/0190891 A1 Jul. 2, 2026

(51) Int. Cl.
*H10P 50/00* (2026.01)
*H10P 76/20* (2026.01)

(52) U.S. Cl.
CPC ........ *H10P 50/692* (2026.01); *H10P 76/2041* (2026.01)

(58) Field of Classification Search
None
See application file for complete search history.

(56) References Cited

U.S. PATENT DOCUMENTS 10,304,744 B1 * 5/2019 Joseph ................. H10D 84/016
2020/0152472 A1 * 5/2020 Devilliers ............. G03F 7/0035
2025/0079174 A1 * 3/2025 Liu ....................... H10P 50/642

FOREIGN PATENT DOCUMENTS

CN 115274564 A 11/2022
CN 118076220 A 5/2024

* cited by examiner

*Primary Examiner* — Shamim Ahmed

(74) *Attorney, Agent, or Firm* — CKC & Partners Co., LLC

(57) ABSTRACT

A forming method of a semiconductor device includes forming multiple first patterns extending along a first direction in a first hard mask layer on a substrate, forming multiple second patterns extending along a second direction in a second hard mask layer on the substrate, forming a hole pattern in a third hard mask layer by using the first patterns and the second patterns, forming a resist layer covering the first center sections of the first patterns, and the second center sections of the second patterns, and removing the end sections of the first patterns and the end sections of the second patterns. Each of the first patterns and the second patterns includes a first center section and two first end sections.

20 Claims, 19 Drawing Sheets

SEMICONDUCTOR DEVICE AND FORMING METHOD OF THE SAME

BACKGROUND

Field of Disclosure

The present disclosure relates to a semiconductor device and a forming method of the semiconductor device.

Description of Related Art

The yield of the capacitor holes of a semiconductor device determined by the quality of a hole pattern as a mask above. However, in a conventional method, a mask is formed to surround the hole pattern and the holes of the hole pattern is exposed. That is, the boundary of such mask is directly approximate to the holes. As a result, the precision requirement of the boundary location of such mask is higher and the quality of the holes is poor. Alignment and overlay measurement of subsequent layers are performed by using an array-like mark which is defined by the mask and the capacitor holes above. Therefore, the poor boundary quality may cause poor alignment and overlay measurement signal. The layers in subsequent process suffer poor alignment and overlay performance.

Therefore, it is still a study direction to provide a method to form high quality hole pattern for capacitor holes.

SUMMARY

One aspect of the present disclosure includes a forming method of a semiconductor device.

In some embodiments, the forming method of a semiconductor device includes forming multiple first patterns extending along a first direction in a first hard mask layer on a substrate, wherein each of the first patterns includes a first center section and two first end sections; forming multiple second patterns extending along a second direction different from the first direction in a second hard mask layer on the substrate, wherein each of the second patterns includes a second center section and two second end sections; forming a hole pattern in a third hard mask layer by using the first patterns and the second patterns, wherein the third hard mask layer is on the substrate and below the first hard mask layer and the second hard mask layer; forming a resist layer covering the first center sections of the first patterns, and the second center sections of the second patterns; and removing the first end sections of the first patterns and the end sections of the second patterns.

Another aspect of the present disclosure includes a forming method of a semiconductor device.

In some embodiments, the forming method of a semiconductor device includes forming a hole pattern in a first hard mask layer on a substrate, wherein the hole pattern includes a center section and multiple end sections around the center section; forming a resist layer covering the center section of the hole pattern; removing the end sections of the hole pattern; and forming multiple capacitor holes by etching the substrate by using the hole pattern.

DETAILED DESCRIPTION

Figure 1:
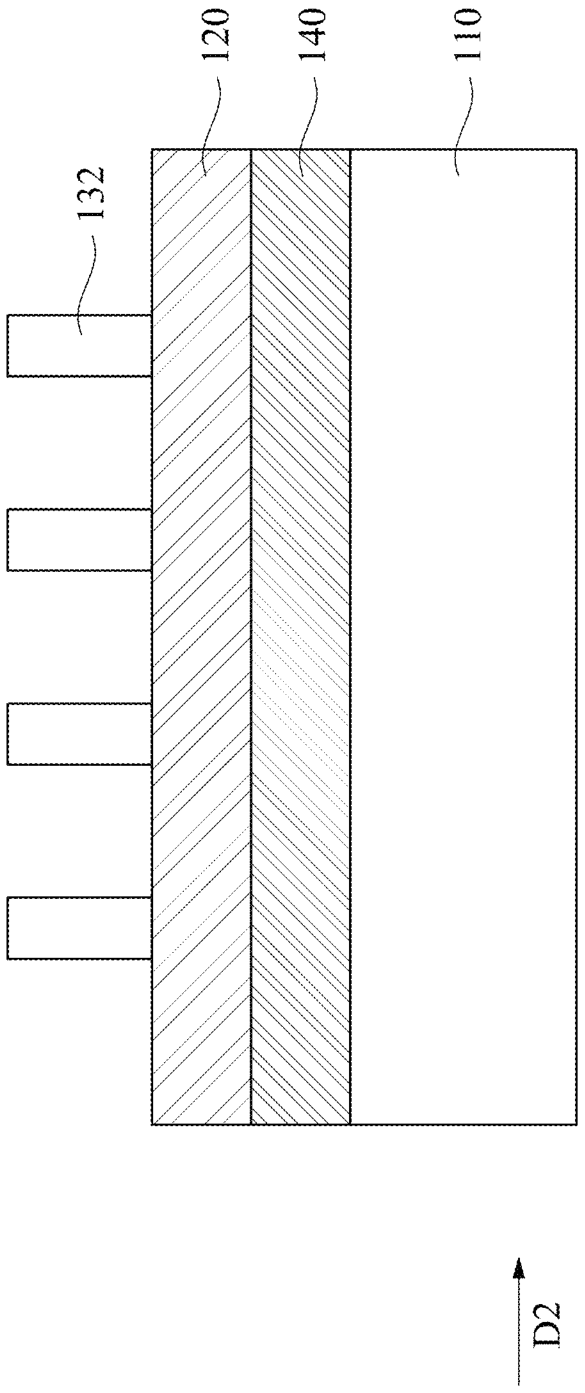
FIG. 1 is a cross-sectional view of an intermediate state of a forming method of the semiconductor device according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Figure 2A:
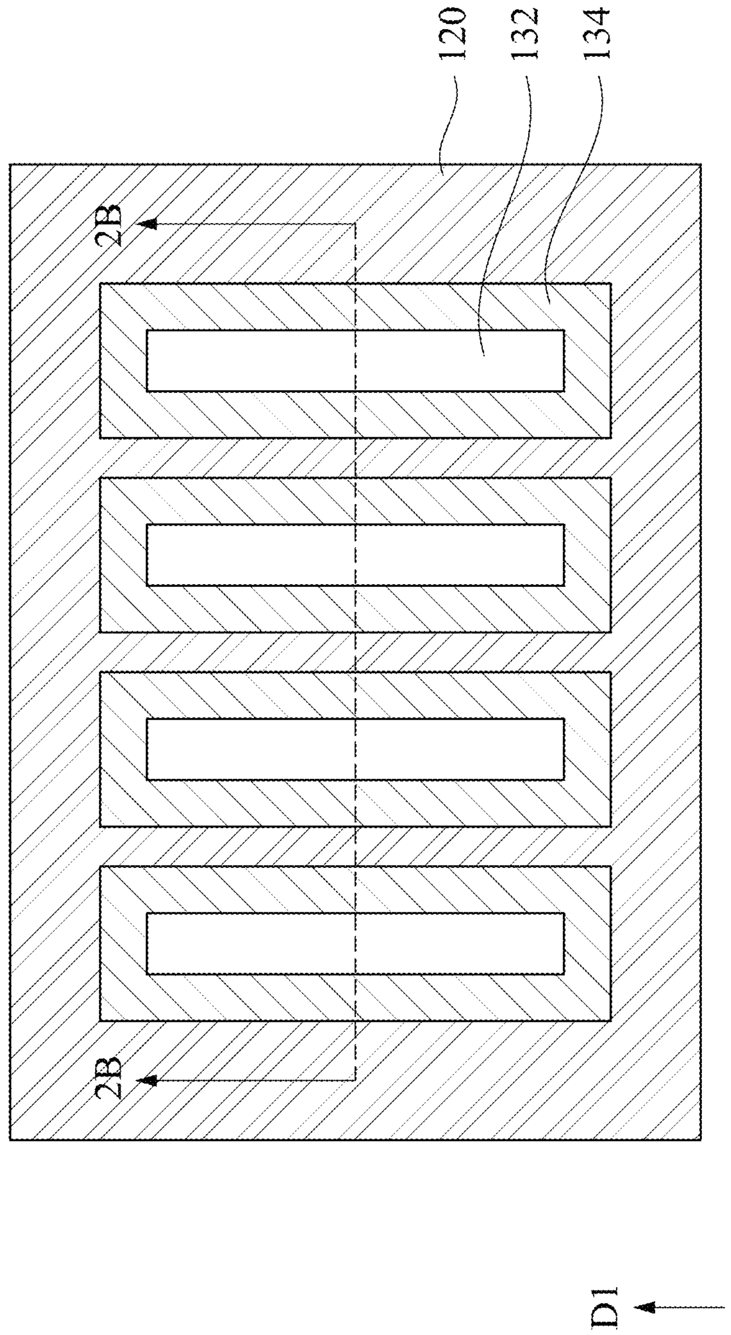
FIG. 2A is a top view of an intermediate state of a forming method of the semiconductor device according to one embodiment of the present disclosure.
Figure 2B:
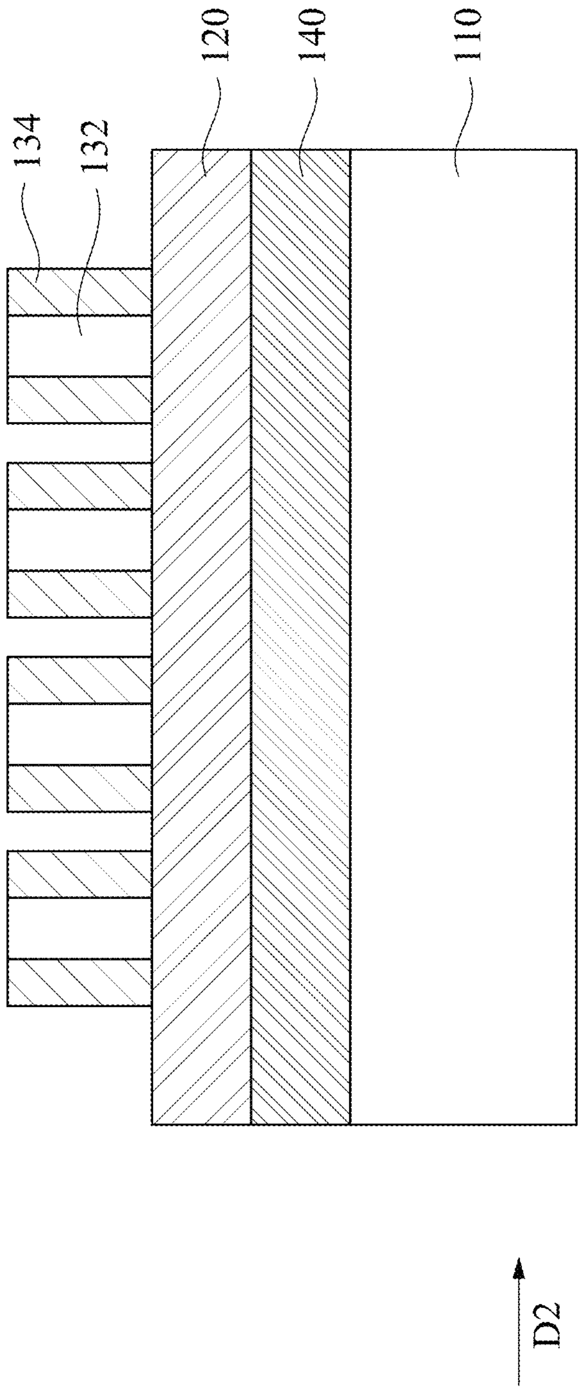
FIG. 2B is a cross-sectional view taken along line 2B-2B in FIG. 2A.
Figure 3A:
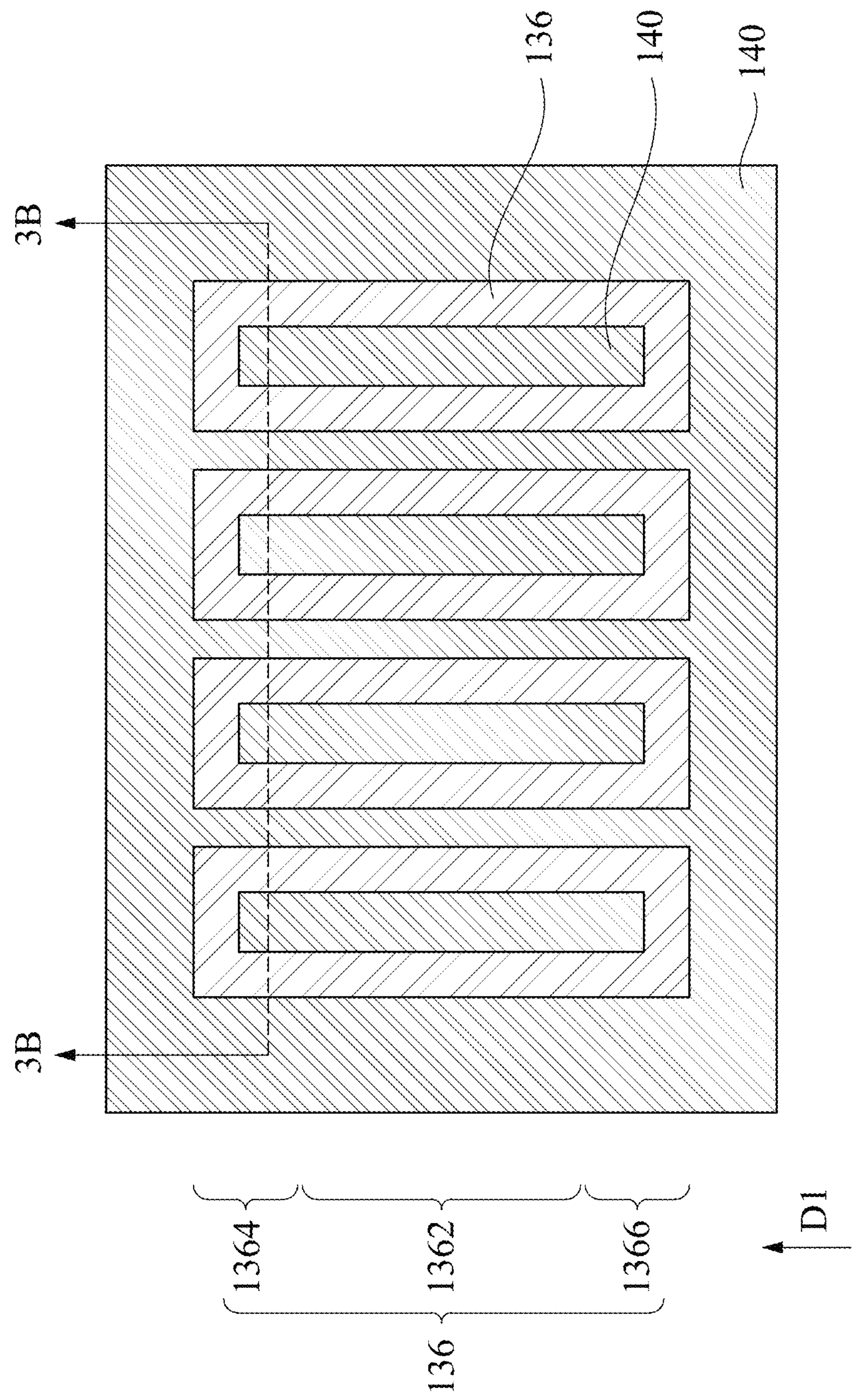
FIG. 3A is a top view of an intermediate state of a forming method of the semiconductor device according to one embodiment of the present disclosure.
Figure 3B:
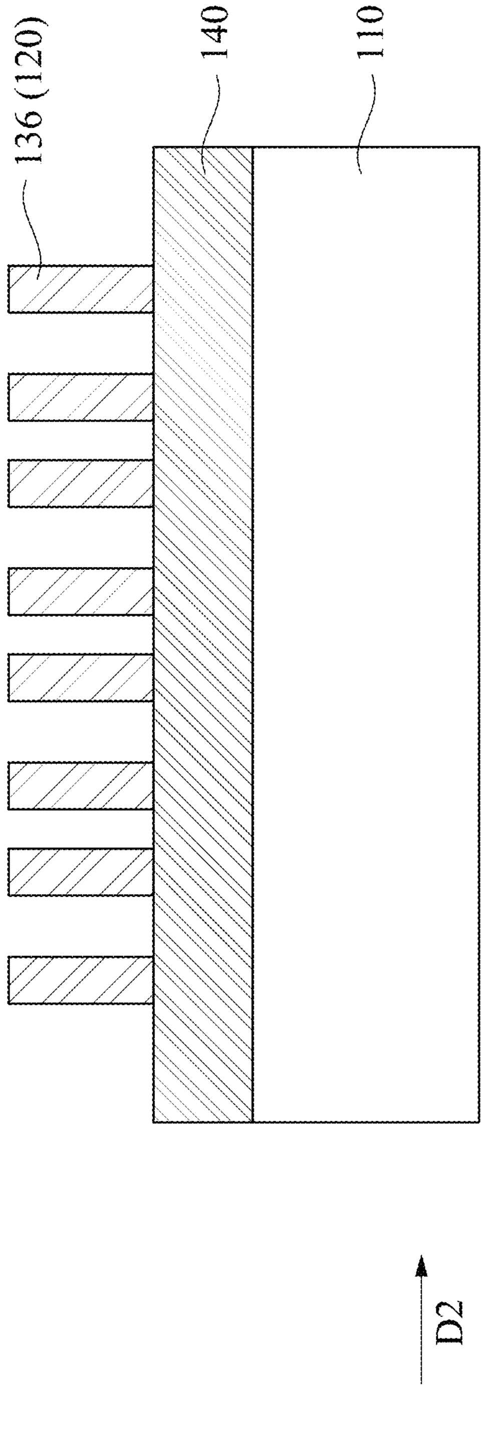
FIG. 3B is a cross-sectional view taken along line 3B-3B in FIG. 3A.

FIG. 1 is a cross-sectional view of an intermediate state of a forming method of the semiconductor device according to one embodiment of the present disclosure. FIG. 2A is top view of an intermediate state of a forming method of the semiconductor device according to one embodiment of the present disclosure. FIG. 2B is a cross-sectional view taken along line 2B-2B in FIG. 2A. FIG. 3A is a top view of an intermediate state of a forming method of the semiconductor device according to one embodiment of the present disclosure. FIG. 3B is a cross-sectional view taken along line 3B-3B in FIG. 3A.

The forming method of a semiconductor device begins with a step of forming multiple first patterns 136 (FIG. 3B)

extending along a first direction D1 in a first hard mask layer 120 on a substrate 110. The first hard mask layer 120 is disposed on a third hard mask layer 140, and the third hard mask layer 140 is disposed on the substrate 110. The substrate 110 includes multiple layers, such as bottom silicon nitride layer, BPSG (Boro-phospho-silicate Glass) layer, oxide layer, and top silicon nitride layer. As an example, the steps of forming the first patterns 136 are shown in FIG. 1, FIG. 2A, FIG. 2B, FIG. 3A, and FIG. 3B. In the present embodiment, the method of forming the first patterns 136 is self-aligned double patterning (SADP) method. In other embodiment, the method of forming the first patterns 136 can be litho-etch-litho-etch (LELE) method, litho-freeze-litho-etch (LFLE) method, or other suitable methods.

As shown in FIG. 1. Multiple first dummy patterns 132 are formed on the first hard mask layer 120. As shown in FIG. 2A and FIG. 2B, multiple first spacers 134 are formed to surround the first dummy patterns 132 respectively. Specifically, the material of the first spacers is deposited to cover the first dummy patterns 132 and the first hard mask layer 120 first, and then the portions of the material above the first hard mask layer 120 and above the top surface of the first dummy patterns 132 are removed. Therefore, as shown in FIG. 2A, each of the first spacers 134 has a rectangular shape surrounding the first dummy patterns 132, and the first dummy patterns 132 are exposed.

As shown in FIG. 3A and FIG. 3B. The first dummy patterns 132 are removed, and the first hard mask layer 120 is etched by using the first spacers 134 as mask to form the first patterns 136. Each of the first patterns 136 includes a first center section 1362 and two first end sections 1364, 1366. The first center section 1362 corresponds to the section which will be used to form capacitor holes in the subsequent process. The first end sections 1364, 1366 correspond to the sections which will be removed later in the subsequent process.

Figure 4A:
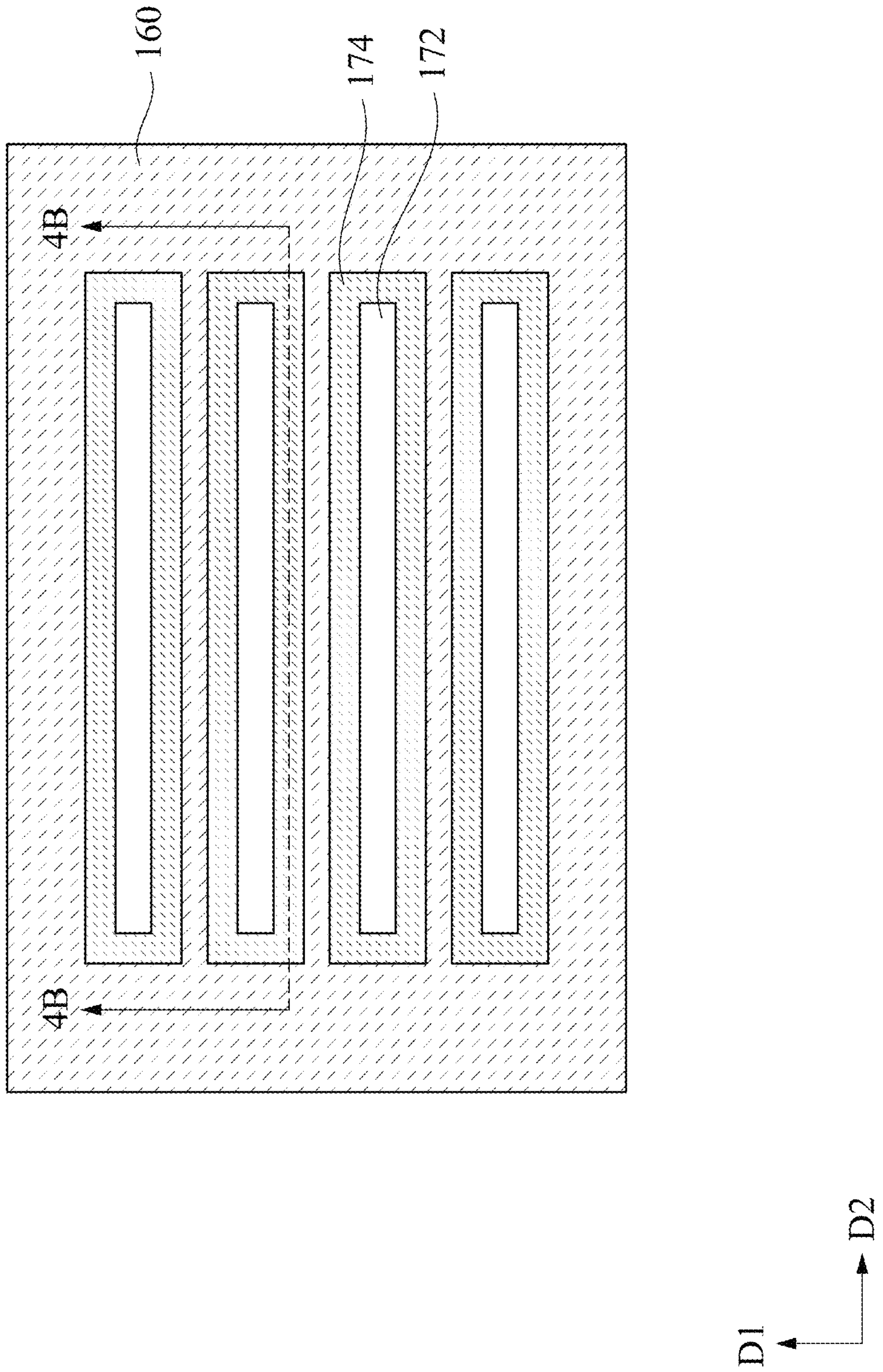
FIG. 4A is a top view of an intermediate state of a forming method of the semiconductor device according to one embodiment of the present disclosure.
Figure 4B:
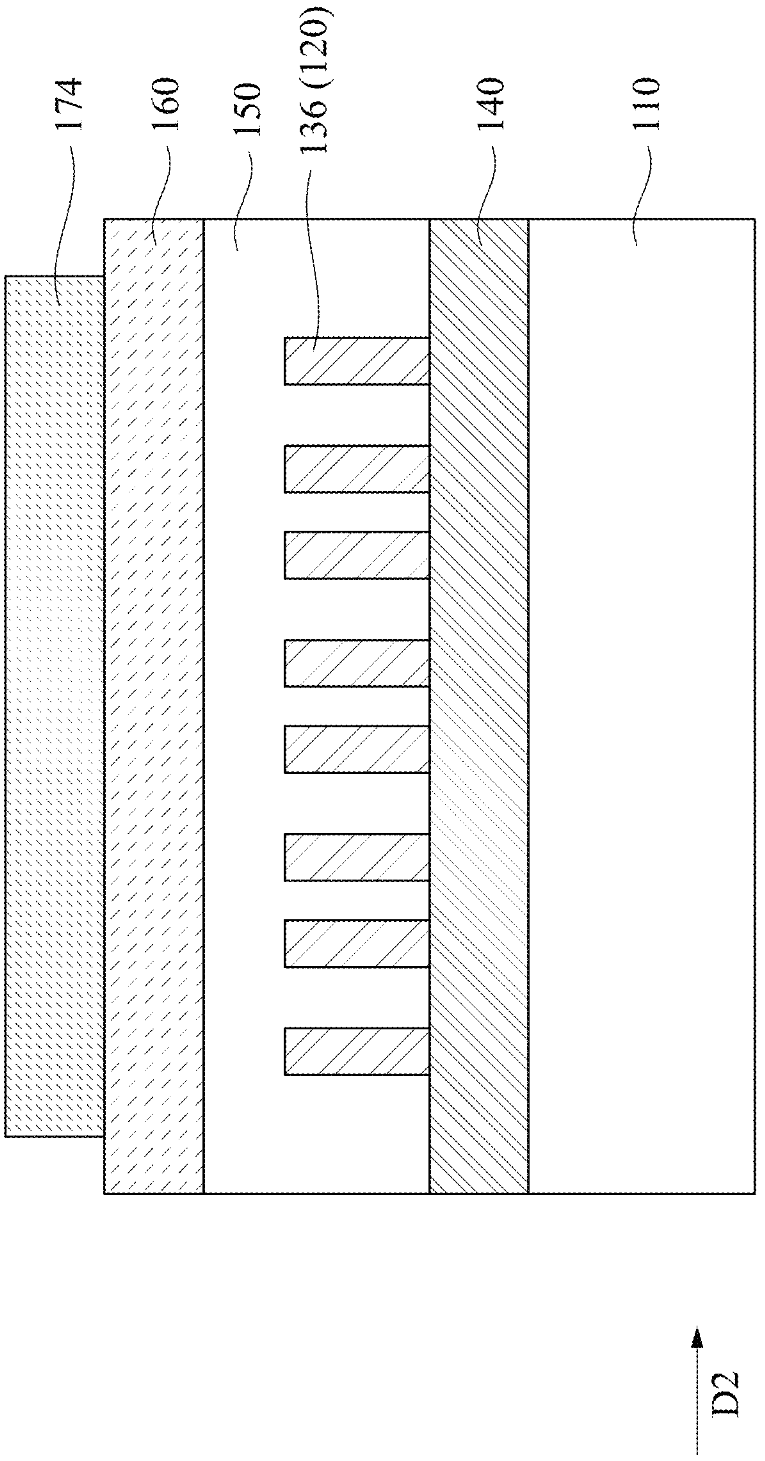
FIG. 4B is a cross-sectional view taken along line 4B-4B in FIG. 4A.
Figure 5A:
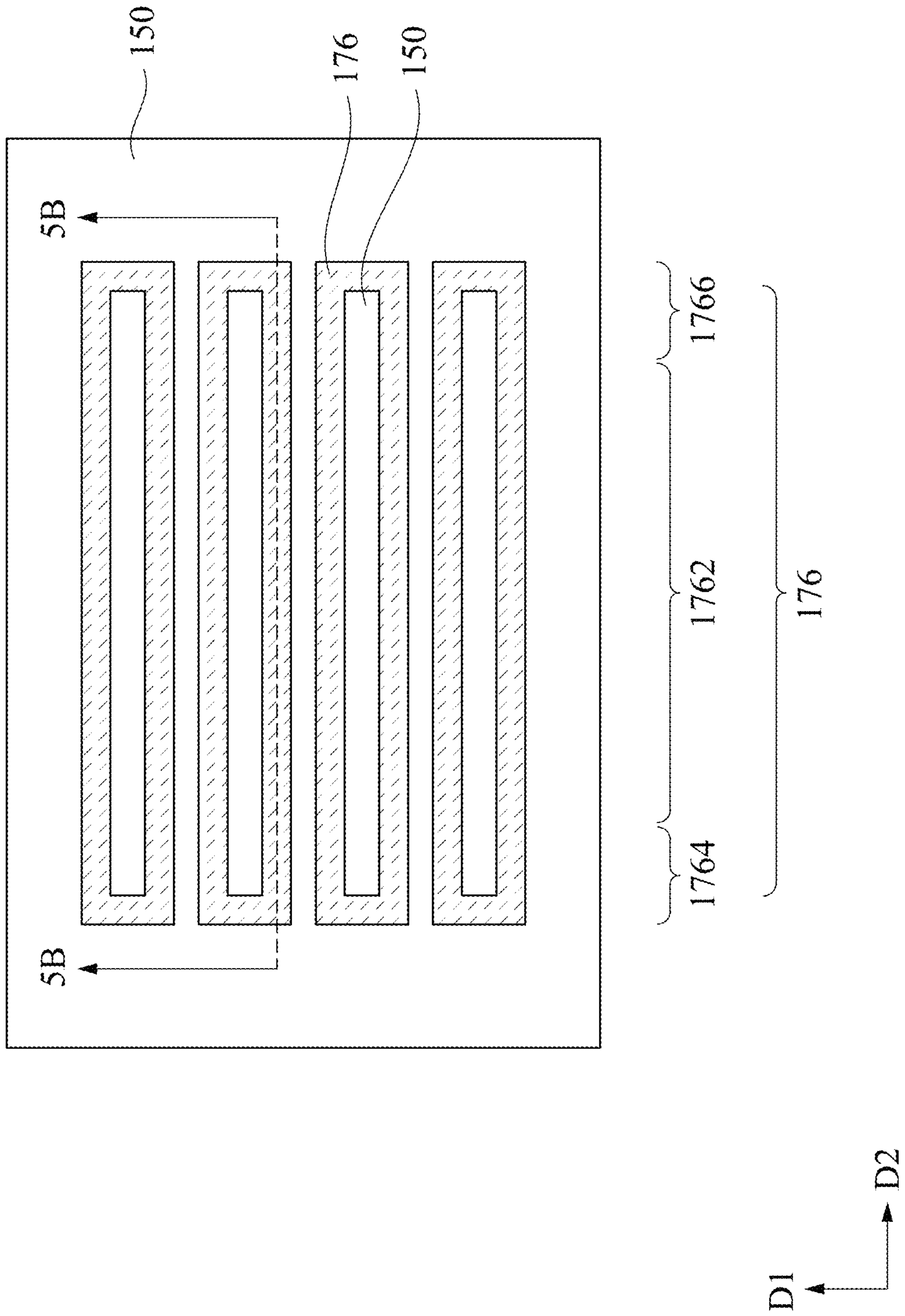
FIG. 5A is a top view of an intermediate state of a forming method of the semiconductor device according to one embodiment of the present disclosure.
Figure 5B:
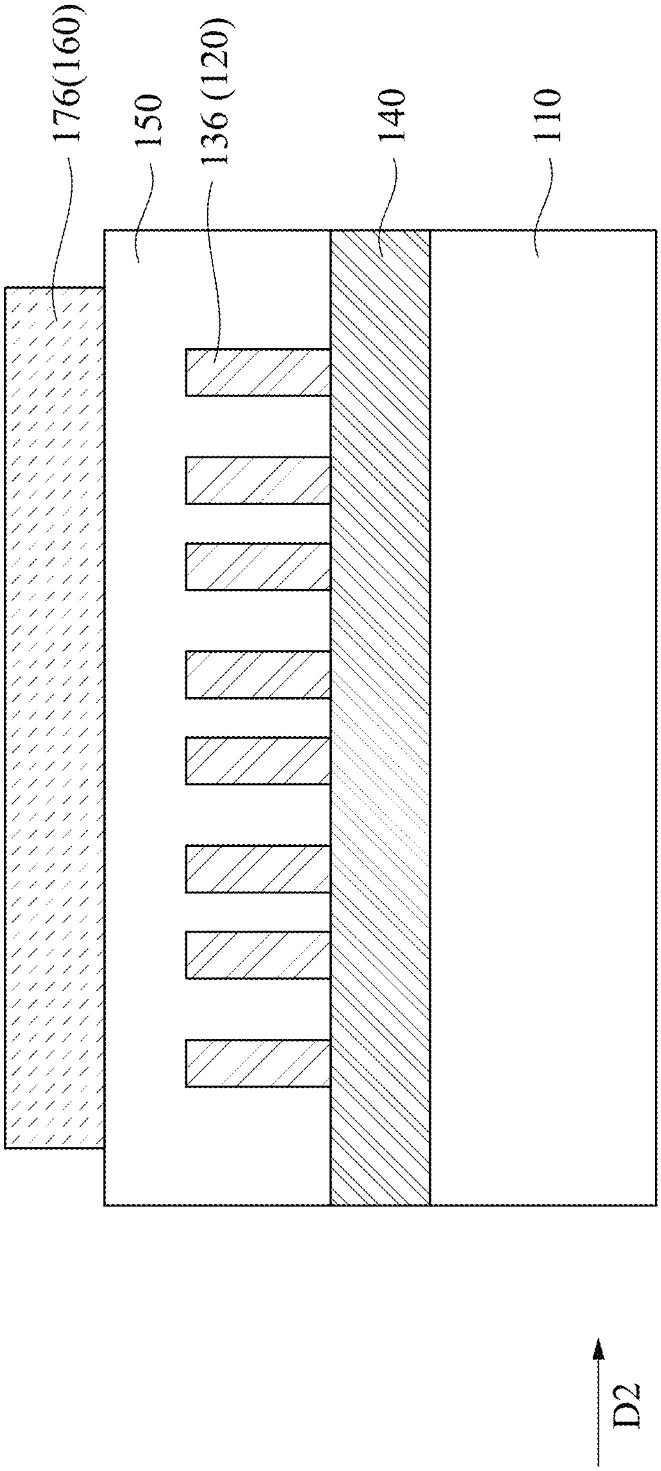
FIG. 5B is a cross-sectional view taken along line 5B-5B in FIG. 5A.

FIG. 4A is a top view of an intermediate state of a forming method of the semiconductor device according to one embodiment of the present disclosure. FIG. 4B is a cross-sectional view taken along the line 4B-4B in FIG. 4A. FIG. 5A is a top view of an intermediate state of a forming method of the semiconductor device according to one embodiment of the present disclosure. FIG. 5B is a cross-sectional view taken along line 5B-5B in FIG. 5A.

The method continues with a step of forming multiple second patterns 176 extending along a second direction D2 different from the first direction D1 in a second hard mask layer 160 on the substrate 110. As shown in FIG. 4A, the first spacer 134 and the first patterns 136 are covered by a dielectric layer 150, and a second hard mask layer 160 is disposed on the dielectric layer 150. The second dummy patterns 172 are formed on the second hard mask layer 160. The second spacers 174 are formed surrounding the second dummy patterns 172. The process of forming the second dummy patterns 172 and the second spacers 174 are substantially the same as the process of forming the first dummy patterns 132 and the first spacers 134 as shown in FIG. 1 and FIG. 2B.

As shown in FIG. 5A and FIG. 5B. The second dummy patterns 172 are removed, and the second hard mask layer 160 is etched by using the second spacers 174 as mask to form the second patterns 176. Each of the second patterns 176 includes a second center section 1762 and two second end sections 1764, 1766. The second center section 1762 corresponds to the section which will be used to form capacitor holes in the subsequent process. The second end sections 1764, 1766 correspond to the sections which will be removed later in the subsequent process. In the present embodiment, the first direction D1 is perpendicular to the second direction D2, but the present disclosure is not limited thereto.

Figure 6B:
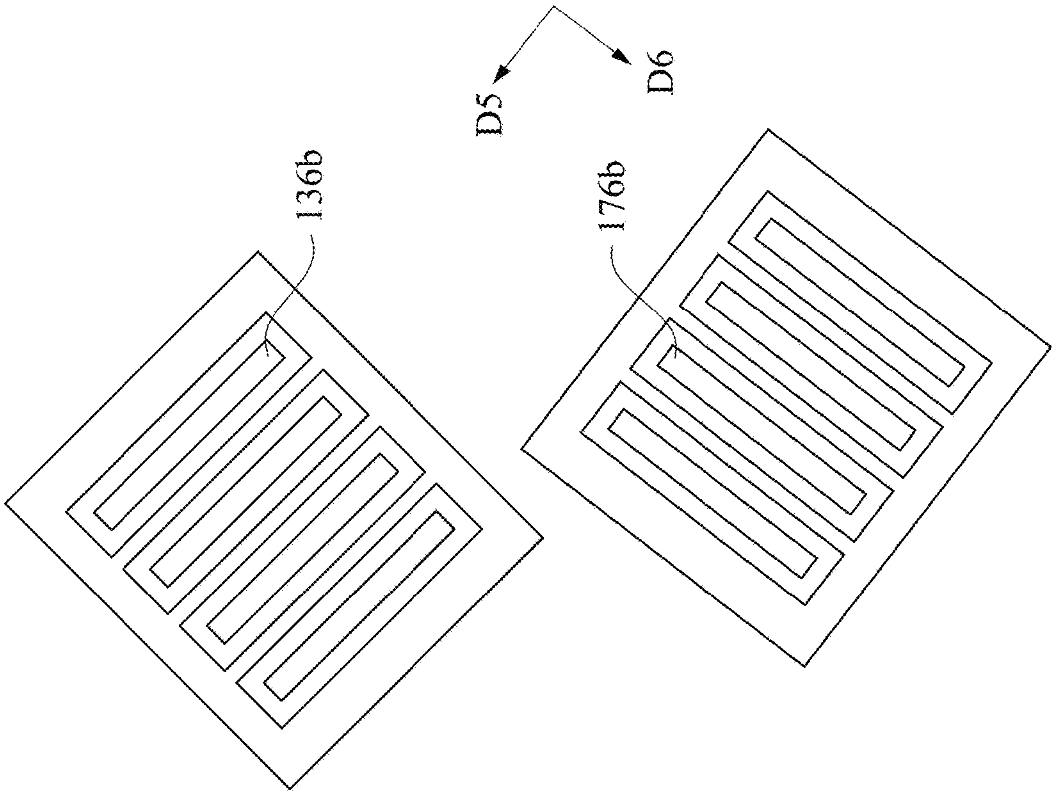
FIG. 6A and FIG. 6B are first patterns and second patterns according to various embodiments of the present disclosure.
Figure 6A:
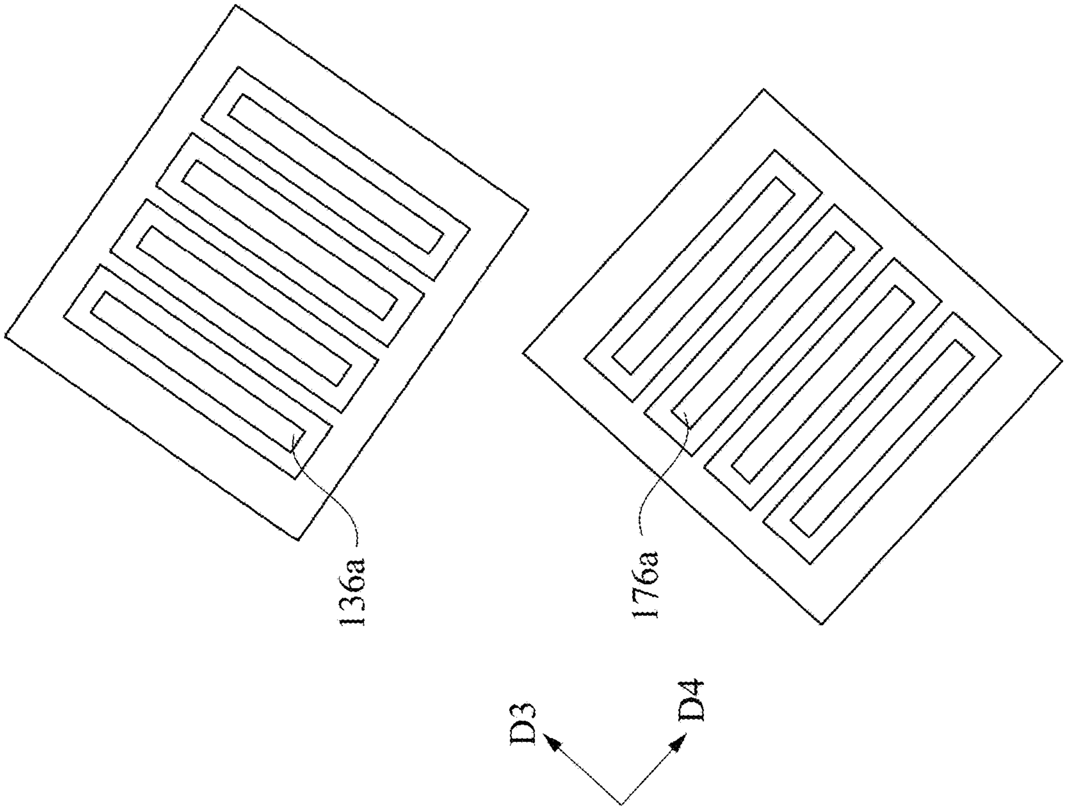

FIG. 6A and FIG. 6B are first patterns and second patterns according to various embodiments of the present disclosure. As shown in FIG. 6A, first patterns 136*a* and the second patterns 176*a* are extend along a third direction D3 and a fourth direction D4 different from the first direction D1 and the second direction D2. The direction difference between the third direction D3 and the fourth direction D4 can be different from 90 degrees. As shown in FIG. 6B, first patterns 136*b* and the second patterns 176*b* are extend along a fifth direction D5 and a sixth direction D6 different from the first direction D1 and the second direction D2. The direction difference between the fifth direction D5 and the sixth direction D6 can be different from 90 degrees.

Figure 7A:
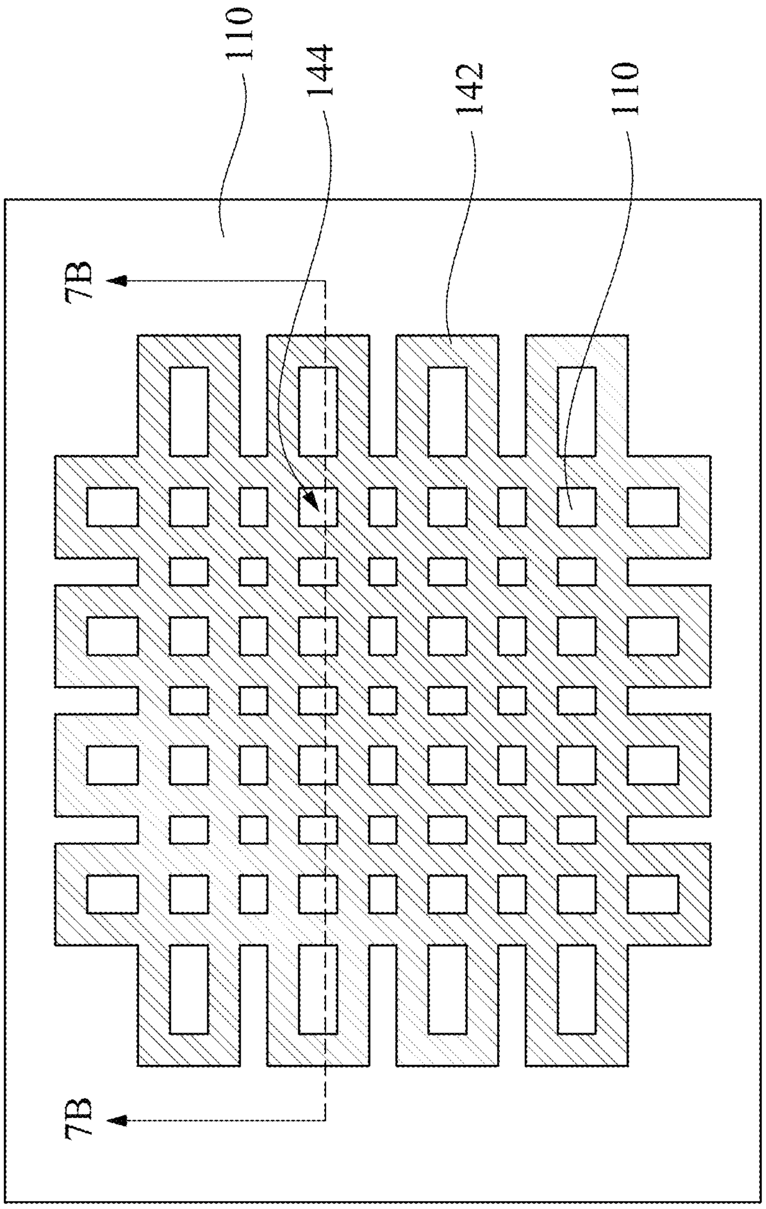
FIG. 7A is a top view of an intermediate state of a forming method of the semiconductor device according to one embodiment of the present disclosure.
Figure 7B:
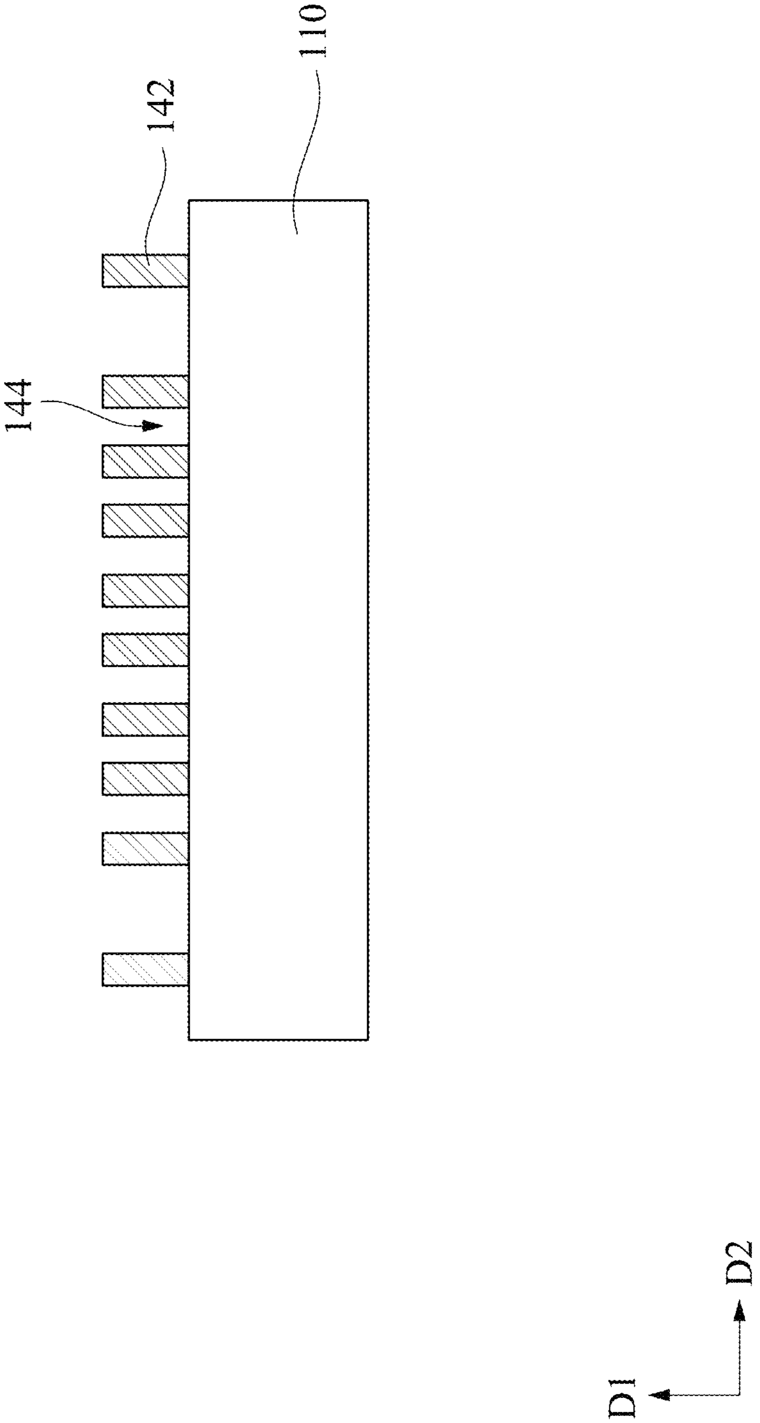
FIG. 7B is a cross-sectional view taken along line 7B-7B in FIG. 7A.

FIG. 7A is a top view of an intermediate state of a forming method of the semiconductor device according to one embodiment of the present disclosure. FIG. 7B is a cross-sectional view taken along line 7B-7B in FIG. 7A. The forming method of the semiconductor device continues with a step of forming a hole pattern 142 in the third hard mask layer 140 by using the first patterns 136 and the second patterns 176 as a mask. The third hard mask layer 140 is etched to transfer the first patterns 136 and the second patterns 176 to form the hole pattern 142. Therefore, the first center section 1362 of the first patterns 136 (FIG. 3A) across the second center section 1762 of the second patterns 176 (FIG. 5A) and form multiple holes 144. Alternatively speaking, the first center section 1362 of the first patterns 136 (FIG. 3A) across the second center section 1762 of the second patterns 176 define a center section of the hole pattern 142. A dimension of the holes 144 of the hole pattern 142 is from 20×20 nm^2 to 50×50 nm^2.

Figure 8A:
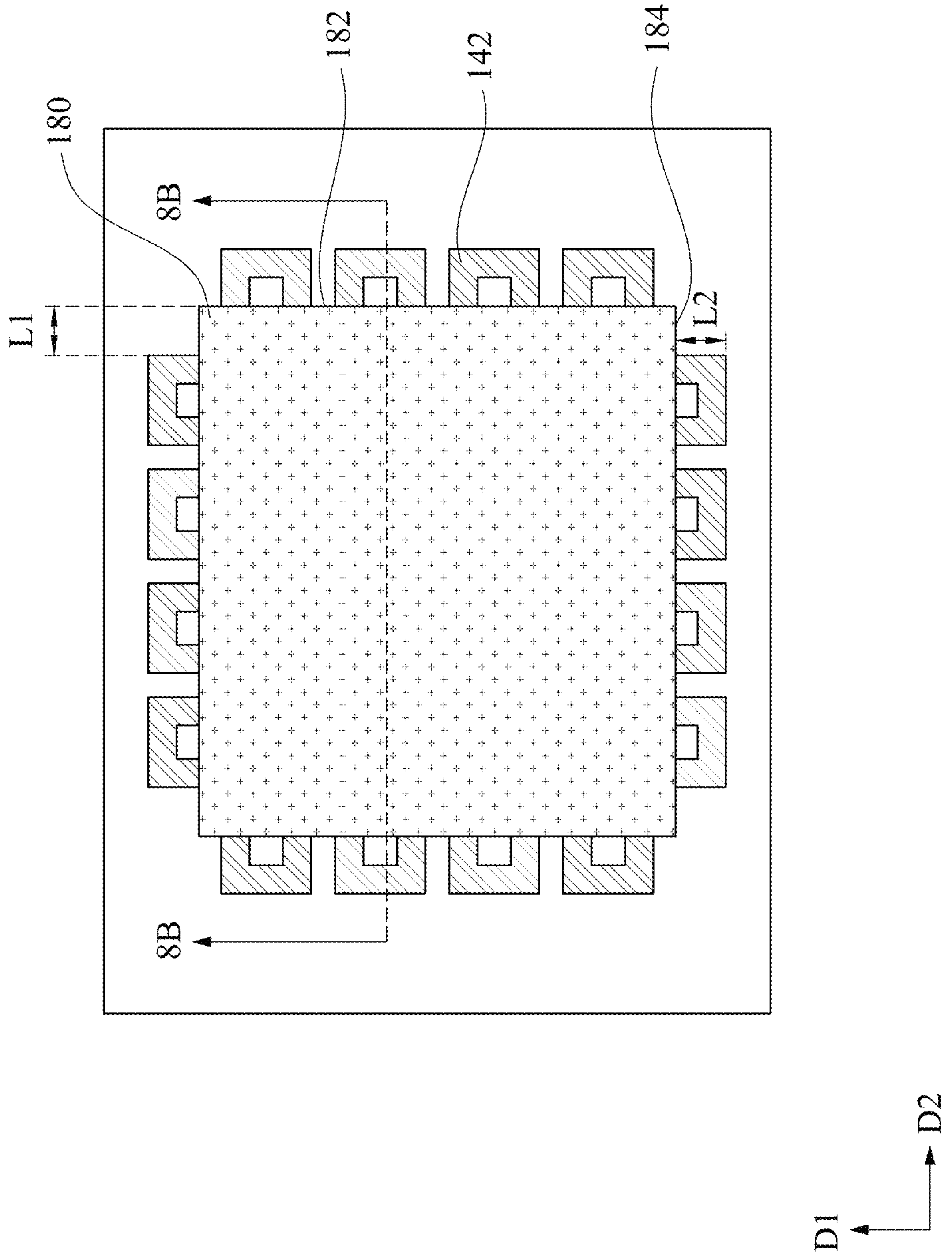
FIG. 8A is a top view of an intermediate state of a forming method of the semiconductor device according to one embodiment of the present disclosure.
Figure 8B:
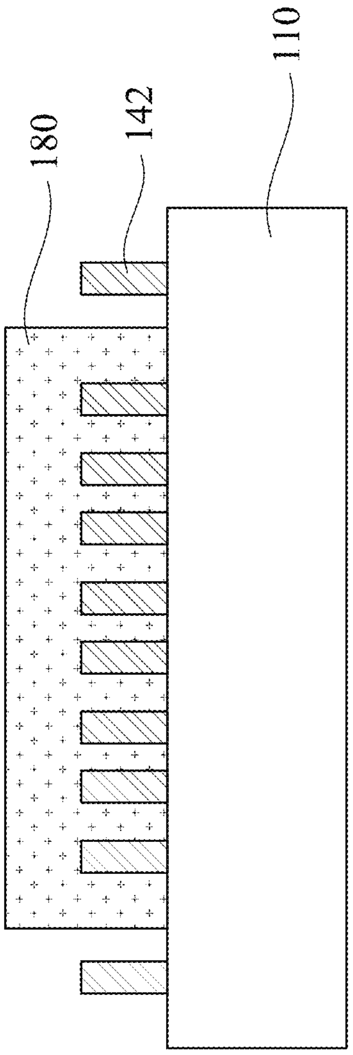
FIG. 8B is a cross-sectional view taken along line 8B-8B in FIG. 8A.

FIG. 8A is a top view of an intermediate state of a forming method of the semiconductor device according to one embodiment of the present disclosure. FIG. 8B is a cross-sectional view taken along line 8B-8B in FIG. 8A. The forming method of the semiconductor device continues with a step of forming a resist layer 180 covering the first center sections 1362 of the first patterns 136 and the second center sections 1762 of the second patterns 176. That is, the multiple holes 144 of the hole pattern 142 are covered by a resist layer 180. The end sections 1364, 1366 of the first patterns 136 and the second end sections 1764, 1766 of the second patterns 176 are exposed from the resist layer 180.

Reference is made to FIG. 8B. A first edge 182 of the resist layer 180 along the first direction D1 and one of the first patterns 136 closest to the first edge 182 have a first distance L1 therebetween, and the first distance L1 is in a range from 0 to 50 nm. Similarly, a second edge 184 of the resist layer 180 along the second direction D2 and one of the second patterns 176 closest to the second edge 184 have a second distance L2 therebetween, and the second distance is in a range from 0 to 50 nm.

With such method, the distance L1 does not affect the shapes of the holes 144. In other words, the precision of the boundary location of the resist layer 180 can be loose. In a conventional method, a resist layer is formed to cover the periphery area of the hole pattern 142. That is, the resist layer covers the end sections 1364, 1366 of the first patterns 136 and the end sections 1764, 1766 of the second patterns 176, and the boundary of the resist layer is directly approximate to the holes 144. As a result, the precision requirement of the boundary location of such resist layer is higher. Otherwise, the shapes of the holes 144 may be affected.

Figure 9:
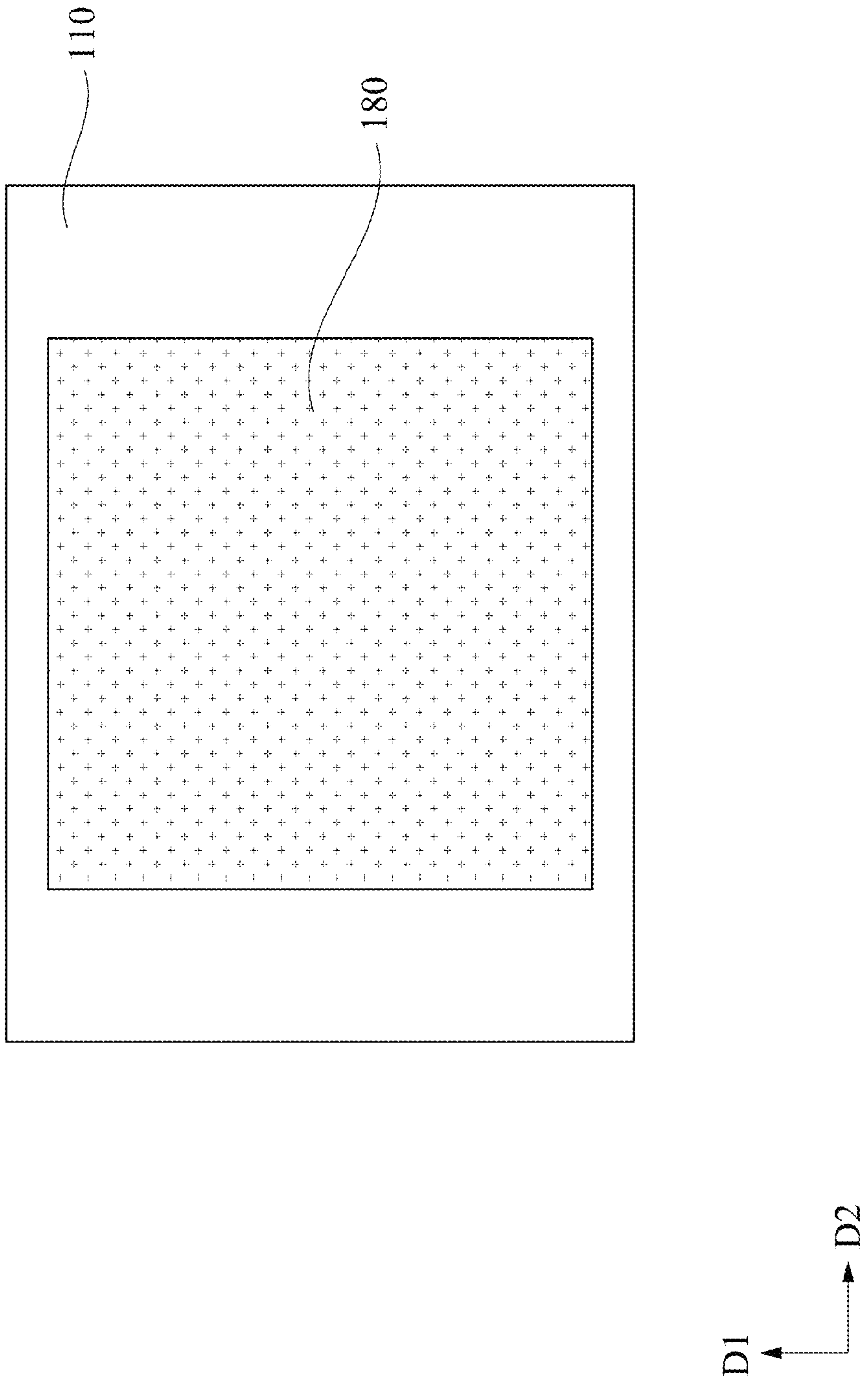
FIG. 9 is a top view of an intermediate state of a forming method of the semiconductor device according to one embodiment of the present disclosure.

FIG. 9 is a top view of an intermediate state of a forming method of the semiconductor device according to one embodiment of the present disclosure. Reference is made to FIG. 8A and FIG. 9. The forming method of the semiconductor device continues with a step of removing the first end sections 1364, 1366 of the first patterns 136 and the second end sections 1764, 1766 of the second patterns 176. After removing the first end sections 1364, 1366 and the second end sections 1764, 1766, the resist layer 180 is removed to expose the first center sections 1362 of the first patterns 136 and the second center sections 1762 of the second patterns 176.

Figure 10A:
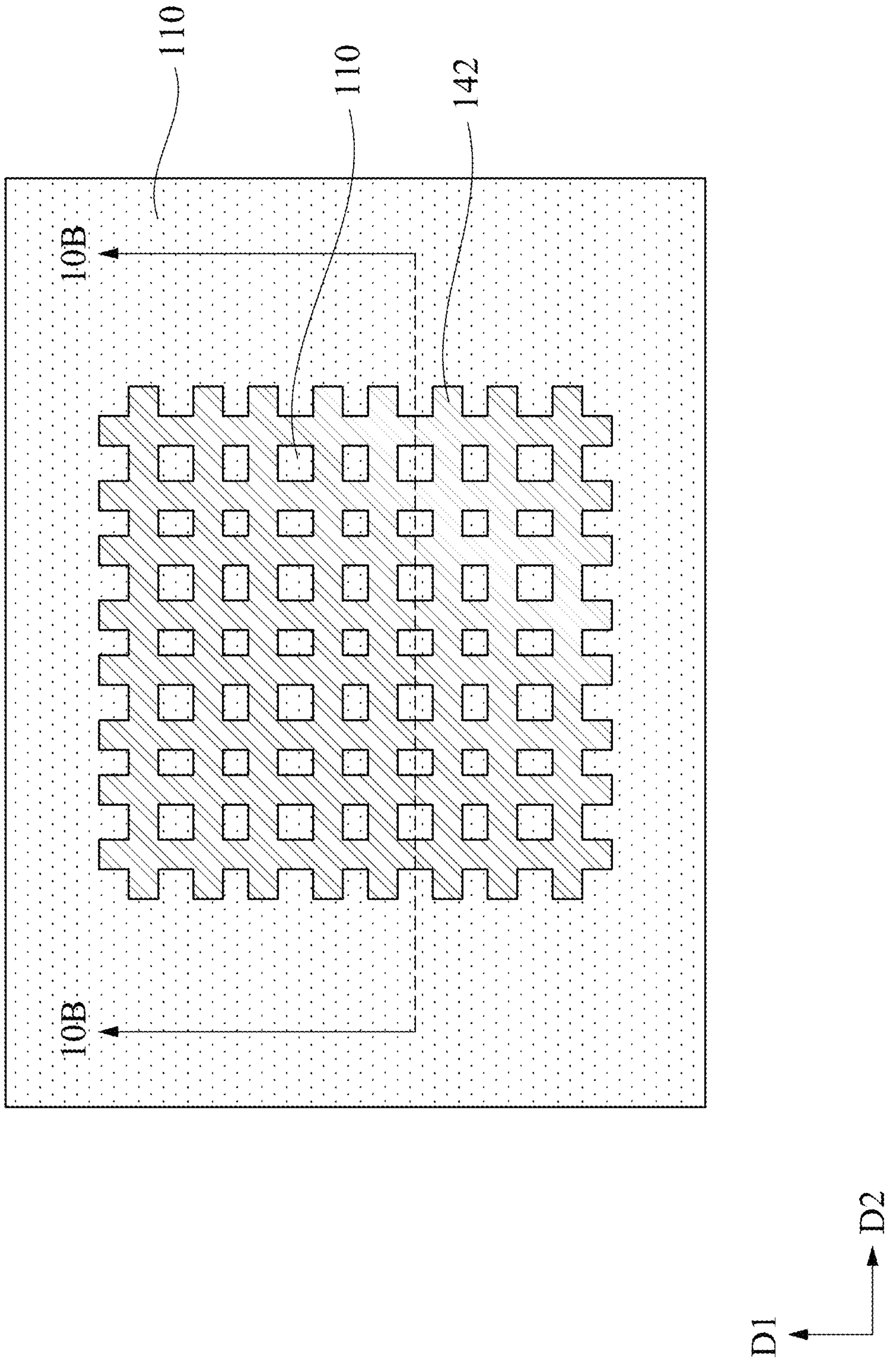
FIG. 10A is a top view of an intermediate state of a forming method of the semiconductor device according to one embodiment of the present disclosure.
Figure 10B:
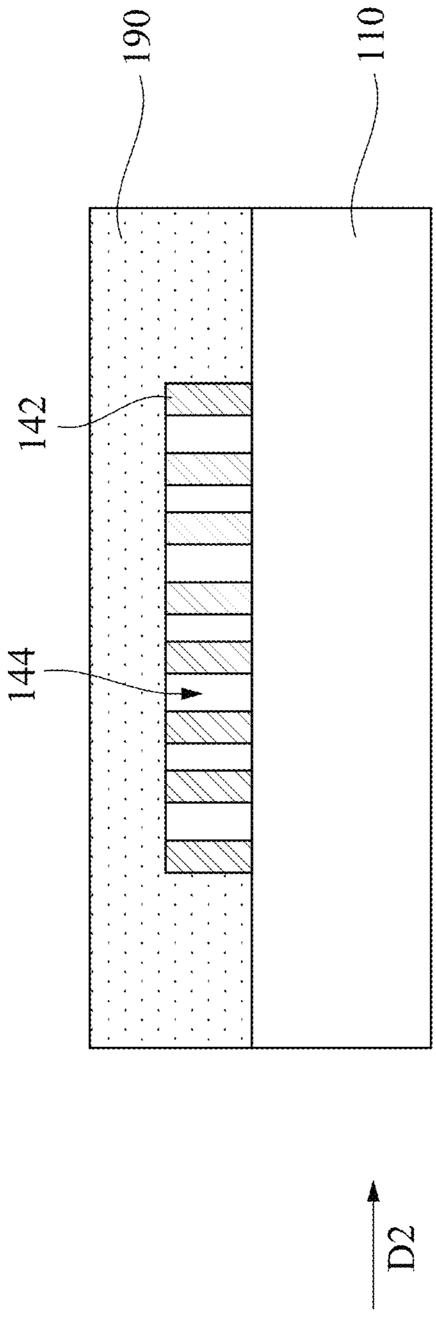
FIG. 10B is a cross-sectional view taken along line 10B-10B in FIG. 10A.

FIG. 10A is a top view of an intermediate state of a forming method of the semiconductor device according to one embodiment of the present disclosure. FIG. 10B is a cross-sectional view taken along line 10B-10B in FIG. 10A. The forming method of the semiconductor device continues with a step of filling a gap fill material 190 around the hole pattern 142, wherein the gap fill material 190 is not filled inside the holes 144. Reference is made to FIG. 10B. Since the gap fill material 190 has a lower resin flowability, a higher molecular weight, a higher etching resistance, a higher planarization, and has high reactive resin, the gap fill material 190 is not filled inside the holes 144 of the hole pattern 142.

Figure 11:
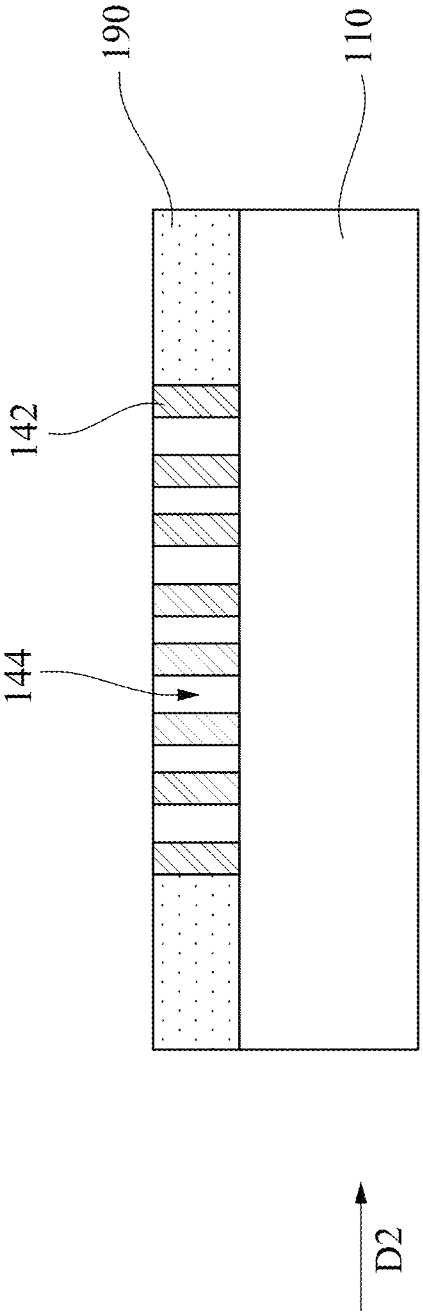
FIG. 11 is a cross-sectional view of an intermediate state of a forming method of the semiconductor device according to one embodiment of the present disclosure.

FIG. 11 is a cross-sectional view of an intermediate state of a forming method of the semiconductor device according to one embodiment of the present disclosure. The forming method of the semiconductor device continues with a step of polishing back or etching back the gap fill material 190 until a top surface of the hole pattern 142 is exposed to make sure that there is no residual gap fill material in the holes. Since the gap fill material 190 cannot be filled inside the holes, and therefore it is beneficial to keep the shapes of the holes.

Figure 12:
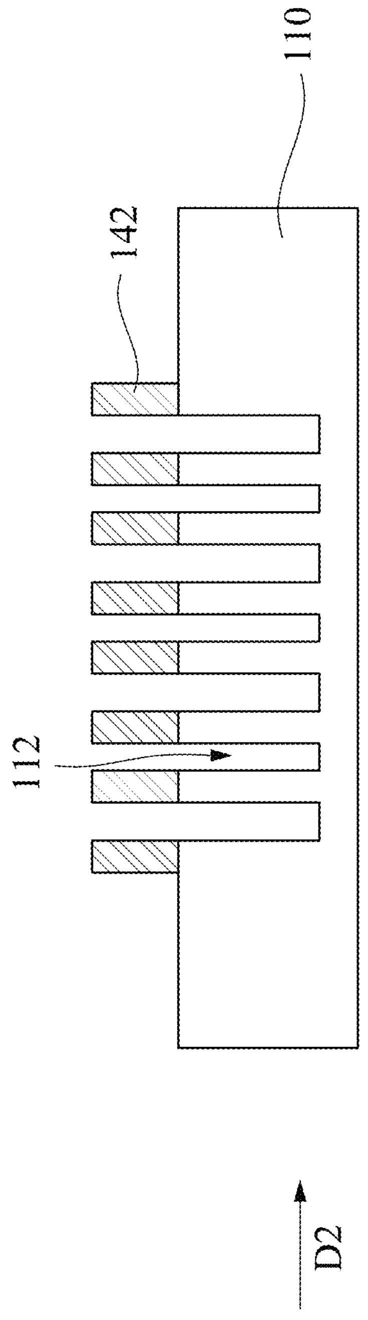
FIG. 12 is a cross-sectional view of an intermediate state of a forming method of the semiconductor device according to one embodiment of the present disclosure.

FIG. 12 is a cross-sectional view of an intermediate state of a forming method of the semiconductor device according to one embodiment of the present disclosure. The method continues with a step of etching the substrate 110 by using the hole pattern 142 to form the capacitor holes 112.

In summary, the method of the present disclosure can make the precision of the boundary location of the resist layer can be loose by using the resist layer to cover the first center sections of the first pattern and the second center section of the second pattern. In addition, since the gap fill material cannot be filled inside the holes, and therefore it is beneficial to keep the shapes of the holes. As such, it can improve the yield of the capacitor holes.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A forming method of a semiconductor device, comprising:

forming a plurality of first patterns extending along a first direction in a first hard mask layer on a substrate, wherein each of the first patterns comprises a first center section and two first end sections;

forming a plurality of second patterns extending along a second direction different from the first direction in a second hard mask layer on the substrate, wherein each of the second patterns comprises a second center section and two second end sections;

forming a hole pattern in a third hard mask layer by using the first patterns and the second patterns, wherein the third hard mask layer is on the substrate and below the first hard mask layer and the second hard mask layer;

forming a resist layer covering the first center sections of the plurality of first patterns, and the second center sections of the plurality of second patterns; and removing the first end sections of the first patterns and the second end sections of the second patterns.

2. The forming method of the semiconductor device of claim 1, wherein forming the plurality of first patterns further comprises:

forming a plurality of first dummy patterns on the first hard mask layer;

forming a plurality of first spacers surrounding the plurality of first dummy patterns respectively;

removing the plurality of first dummy patterns; and etching the first hard mask layer by using the first spacers to form the first patterns.

3. The forming method of the semiconductor device of claim 2, wherein forming the plurality of first pattern further comprises:

forming a plurality of second dummy patterns on the second hard mask layer;

forming a plurality of second spacers surrounding the plurality of second dummy patterns respectively;

removing the plurality of second dummy patterns; and etching the second hard mask layer by using the second spacers to form the second patterns.

4. The forming method of the semiconductor device of claim 1, wherein forming the resist layer covering the first center sections of the plurality of first patterns and the second center sections of the plurality of second patterns further comprises:

forming the resist layer such that the first end sections of the plurality of first patterns and the second end sections of the plurality of second patterns are exposed from the resist layer.

5. The forming method of the semiconductor device of claim 1, wherein forming the resist layer covering the first center sections of the plurality of first patterns and the second center sections of the plurality of second patterns further comprises:

forming the resist layer such that a first edge of the resist layer along the first direction and one of the first patterns closest to the first edge have a first distance therebetween, and the first distance is in a range from 0 to 50 nm.

6. The forming method of the semiconductor device of claim 1, wherein forming the resist layer covering the first center sections of the plurality of first patterns, and the center sections of the plurality of second patterns further comprises:

forming the resist layer such that a second edge of the resist layer along the second direction and one of the second patterns closest to the second edge have a second distance therebetween, and the second distance is in a range from 0 to 50 nm.

7. The forming method of the semiconductor device of claim 1, wherein forming the hole pattern in the third hard mask layer by using the first patterns and the second patterns further comprises:

a dimension of a plurality of holes of the hole pattern is from 20×20 nm^2 to 50×50 nm^2.

8. The forming method of the semiconductor device of claim 1, further comprising:

filling a gap fill material around the hole pattern, wherein the gap fill material is not filled inside a plurality of holes of the hole pattern.

9. The forming method of the semiconductor device of claim 8, wherein the gap fill materia is a low flowability material.

10. The forming method of the semiconductor device of claim 8, further comprising:

etching the gap fill material to expose a top surface of the hole pattern.

11. The forming method of the semiconductor device of claim 10, further comprising:

forming a plurality of capacitor holes by etching the substrate by using the hole pattern.

12. A forming method of a semiconductor device, comprising:

forming a hole pattern in a first hard mask layer on a substrate, wherein the hole pattern comprises a center section and a plurality of end sections around the center section;

forming a resist layer covering the center section of the hole pattern;

removing the end sections of the hole pattern; and forming a plurality of capacitor holes by etching the substrate by using the hole pattern.

13. The forming method of the semiconductor device of claim 12, wherein forming the hole pattern in the first hard mask layer further comprises:

a dimension of a plurality of holes of the hole pattern is from 20×20 nm^2 to 50×50 nm^2.

14. The forming method of the semiconductor device of claim 13, further comprising:

filling a gap fill material around the hole pattern, wherein the gap fill material is not filled inside the holes.

15. The forming method of the semiconductor device of claim 14, wherein forming the hole pattern in the first hard mask layer further comprises:

etching the gap fill material to expose a top surface of the hole pattern.

16. The forming method of the semiconductor device of claim 12, wherein forming the hole pattern in the first hard mask layer further comprises:

forming a plurality of first patterns extending along a first direction in a second hard mask layer on the substrate, wherein each of the first patterns comprises a first center section and two first end sections.

17. The forming method of the semiconductor device of claim 16, wherein forming the resist layer covering the center section of the hole pattern further comprises:

forming the resist layer such that a first edge of the resist layer along the first direction and one of the first patterns closest to the first edge have a first distance therebetween, and the first distance is in a range from 0 to 50 nm.

18. The forming method of the semiconductor device of claim 17, wherein forming the hole pattern in the first hard mask layer further comprises:

forming a plurality of second patterns extending along a second direction different from the first direction in a third hard mask layer on the substrate, wherein each of the second patterns comprises a second center section and two second end sections.

19. The forming method of the semiconductor device of claim 18, wherein the first center section and the second center section define the center section of the hole pattern.

20. The forming method of the semiconductor device of claim 18, wherein forming the resist layer covering the center section of the hole pattern further comprises:

forming the resist layer such that a second edge of the resist layer along the second direction and one of the second patterns closest to the second edge have a second distance therebetween, and the second distance is in a range from 0 to 50 nm.

* * * * *